(12) United States Patent
Bunch et al.

(10) Patent No.: US 8,847,642 B1
(45) Date of Patent: Sep. 30, 2014

(54) CHARGE PUMP PHASE-LOCKED LOOP CIRCUITS

(71) Applicant: MStar Semiconductor, Inc., ChuPei (TW)

(72) Inventors: Ryan Lee Bunch, Greensboro, NC (US); Walter H. Prada, Winston Salem, NC (US)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 13/864,868

(22) Filed: Apr. 17, 2013

(51) Int. Cl.
*H03L 7/06* (2006.01)
*H03L 7/089* (2006.01)
*H03L 7/093* (2006.01)

(52) U.S. Cl.
CPC .............. *H03L 7/0898* (2013.01); *H03L 7/093* (2013.01)
USPC ........... 327/156; 327/157; 327/536; 327/537; 327/552

(58) Field of Classification Search
CPC ..... H03L 7/093; H03L 7/0891; H03L 7/0893; H03L 7/0898
USPC .......................... 327/156, 157, 536, 537, 552
See application file for complete search history.

(56) References Cited

U.S. PATENT DOCUMENTS

| 4,546,330 | A | 10/1985 | Okada ............................. 331/17 |
| 4,745,372 | A | 5/1988 | Miwa ................................ 331/8 |
| 5,068,626 | A | 11/1991 | Takagi et al. ................... 331/17 |
| 6,573,693 | B2 * | 6/2003 | Okamoto ....................... 323/273 |
| 6,724,265 | B2 | 4/2004 | Humphreys .................... 331/17 |
| 7,427,900 | B2 * | 9/2008 | Manetakis et al. .............. 331/17 |
| 7,719,365 | B2 * | 5/2010 | Sahu et al. ...................... 331/17 |
| 7,898,343 | B1 | 3/2011 | Janesch .......................... 331/16 |
| 2007/0109031 | A1 * | 5/2007 | Lin et al. ....................... 327/157 |
| 2008/0157880 | A1 * | 7/2008 | Fayneh et al. ................... 331/17 |
| 2010/0277245 | A1 * | 11/2010 | Liu ................................. 331/34 |
| 2011/0050301 | A1 | 3/2011 | Perrott .......................... 327/156 |

* cited by examiner

*Primary Examiner* — John Poos
(74) *Attorney, Agent, or Firm* — Edell, Shapiro & Finnan, LLC

(57) ABSTRACT

A charge pump phase-locked loop circuit includes an active loop filter, an adjustable reference voltage source, and a charge pump. The active loop filter includes an amplifier that has a negative input node, a positive input node, and an output node. The adjustable reference voltage source is coupled to the positive input node to provide an adjustable reference voltage. The charge pump is coupled to the negative input node to provide a current to or draw a current from the active loop filter in response to a signal from a phase detector. The charge pump includes a first current source coupled to a first voltage and a second current source electrically coupled to a second voltage, the second current source including a resistor. The second current source is configured such that a current provided by the second current source depends on a resistance value of the resistor and a difference between the reference voltage and the second voltage.

17 Claims, 4 Drawing Sheets

CHARGE PUMP PHASE-LOCKED LOOP CIRCUITS

TECHNICAL FIELD

The present disclosure relates generally to charge pump phase-locked loop circuits.

BACKGROUND

A phase-locked loop (PLL) circuit includes a reference source to provide a reference signal, a phase frequency detector, a charge pump, a loop filter, a voltage controlled oscillator (VCO), and a feedback divider. The output of the voltage controlled oscillator is sent to the feedback divider, which divides the output frequency by an integer. The output of the feedback divider is compared with the reference signal at the phase frequency detector, and the phase difference is used to control a pump-up or pump-down current source in the charge pump to charge or discharge an integrating capacitor in the loop filter. The output voltage of the loop filter is provided to the voltage controlled oscillator to adjust its frequency and phase. The phase-locked loop is a negative feedback loop that is designed so that the frequency of the output of the voltage controlled oscillator is a multiple of that of the reference signal.

A phase-locked loop circuit can track an input frequency or generate a frequency that is a multiple of the input frequency. Phase-locked loop circuits can be used to recover a signal from a noisy communication channel or distribute clock timing pulses in digital circuits.

SUMMARY

In one aspect, an apparatus includes a charge pump phase-locked loop circuit having an active loop filter, an adjustable reference voltage source, and a charge pump. The active loop filter includes an amplifier that has a negative input node, a positive input node, and an output node, in which a feedback path is provided between the output node and the negative input node, the feedback path including a capacitor. The adjustable reference voltage source is electrically coupled to the positive input node of the amplifier to provide a reference voltage that is adjustable. The charge pump is electrically coupled to the negative input node of the amplifier to provide a current to or sink a current from the active loop filter in response to a signal from a phase detector. The charge pump includes a first current source electrically coupled to a first voltage and a second current source electrically coupled to a second voltage, the second current source including a resistor, and the second current source is configured such that a current provided by the second current source depends on a resistance value of the resistor and a difference between the reference voltage and the second voltage.

Implementations of the apparatus can include one or more of the following features. The second voltage can be lower or higher than the first voltage. The apparatus can include a control circuit to control the adjustable reference voltage source to adjust the reference voltage to control a magnitude of the current flowing from the active loop filter to the second current source. The adjustable reference voltage source can include a digital-to-analog converter to receive a digital input signal and output the reference voltage provided to the positive input node of the amplifier. The second current source can include a transistor having a gate node that is configured to receive the signal from the phase detector. The resistor in the second current source can include a variable resistor.

In some examples, the apparatus can include a control circuit to control the variable resistor to adjust the resistance value of the resistor to control a magnitude of the current flowing from the active loop filter to the second current source. The control circuit can be configured to control a magnitude of the current flowing from the active loop filter to the second current source by also controlling the adjustable reference voltage source to adjust the reference voltage. The control circuit can be configured to set the current flowing from the active loop filter to the second current source to a minimum value by setting the resistance of the resistor to a maximum value among a plurality of possible values for the resistance and setting the reference voltage to a minimum value among a plurality of possible values for the reference voltage.

In some examples, the apparatus can include a control circuit to control the variable resistor to adjust the resistance value of the resistor to control a magnitude of the current flowing from the second current source to the active loop filter. The control circuit can be configured to control a magnitude of the current flowing from the second current source to the active loop filter by also controlling the adjustable reference voltage source to adjust the reference voltage. The control circuit can be configured to set the current flowing from the second current source to the active loop filter to a minimum value by setting the resistance of the resistor to a maximum value among a plurality of possible values for the resistance and setting the reference voltage to a minimum value among a plurality of possible values for the reference voltage.

The first current source can include a transistor that is configured to operate in an active region and provide an offset current to the active loop filter. The first current source can be configured to provide an offset current to the active loop filter that is not dependent on the signal from the phase detector, and the second current source can be configured to switch on or off in response to the signal from the phase detector.

In one aspect, an apparatus includes a phase-locked loop circuit having an adjustable voltage reference source to output a reference voltage that is adjustable, an active loop filter, a charge pump circuit, and a control circuit. The active loop filter has a first node, a second node, and third node, in which the first node is configured to receive the reference voltage from the adjustable voltage reference source, the second node has a voltage that is configured to track the reference voltage, and the third node provides a signal to an oscillator. The charge pump circuit is electrically coupled to the second node of the active loop filter to pump current to or draw current from the active loop filter, in which the current drawn from the active loop filter is configured to be dependent on the reference voltage, and an operation of the charge pump circuit is dependent on a signal received from a phase detector. The control circuit controls the reference voltage to control a magnitude of the current drawn from the active loop filter by the charge pump circuit.

Implementations of the apparatus can include one or more of the following features. The charge pump circuit can include a variable resistor, and the control circuit may also control a resistance value of the variable resistor to control the magnitude of the current drawn from the active loop filter by the charge pump circuit. The control circuit can be configured to set the current flowing from the active loop filter to the second current source to a minimum value by setting the resistance of the resistor to a maximum value among a plurality of possible values for the resistance and setting the reference voltage to a minimum value among a plurality of possible values for the reference voltage.

In one aspect, an apparatus includes a phase-locked loop circuit having an active loop filter to provide a control signal to an oscillator, and a charge pump circuit electrically coupled to a node of the active loop filter to pump current to or draw current from the active loop filter. The charge pump circuit has a P-type MOSFET operating in an active region to provide an offset current to the active loop filter, and a current source to draw current from the active loop filter in response to a signal from a phase detector. The current source includes a variable resistor and an N-type MOSFET that is turned on or off by the signal from the phase detector, in which a resistance value of the variable resistor affects an amplitude of the current drawn from the active loop filter to the current source.

In one aspect, an apparatus includes a phase-locked loop circuit having an active loop filter to provide a control signal to an oscillator, and a charge pump circuit electrically coupled to a node of the active loop filter to pump current to or draw current from the active loop filter. The charge pump circuit has an N-type MOSFET operating in an active region to provide an offset current to the active loop filter, and a current source to pump current to the active loop filter in response to a signal from a phase detector. The current source includes a variable resistor and a P-type MOSFET that is turned on or off by the signal from the phase detector, in which a resistance value of the variable resistor affects an amplitude of the current pumped to the active loop filter.

In one aspect, a method of operating a charge pump phase-locked loop circuit is provided. The method includes providing an adjustable reference voltage to a first node of an active loop filter; pumping current to or drawing current from a second node of the active loop filter in response to a signal from a phase detector; providing a signal from the active loop filter to an oscillator; and modifying a level of the reference voltage to adjust an amplitude of the current drawn from or pumped to the active loop filter.

Implementations of the method may include one or more of the following features. Drawing current from the active loop filter can include passing at least a portion of the current through a variable resistor, and the method can include modifying a resistance value of the variable resistor to adjust the amplitude of the current drawn from the active loop filter. The method can include setting the current drawn from the active loop filter to a minimum value by setting the resistance of the variable resistor to a maximum value among a plurality of possible values for the resistance and setting the reference voltage to a minimum value among a plurality of possible values for the reference voltage. The method can include generating the reference voltage using a digital-to-analog converter, and controlling a digital signal provided to the digital-to-analog converter to modify the reference voltage. Pumping current to the active loop filter can include providing an offset current from a transistor operating in an active region. Pumping current to or drawing current from the active loop filter can include operating a P-type transistor in an active region to provide an offset current to the active loop filter, and operating an N-type transistor as a switch to turn on or off the current drawn from the active loop filter in response to the signal from the phase detector. The method can include modifying a level of the reference voltage to adjust an amplitude of the current drawn from the active loop filter.

DETAILED DESCRIPTION

Figure 1:
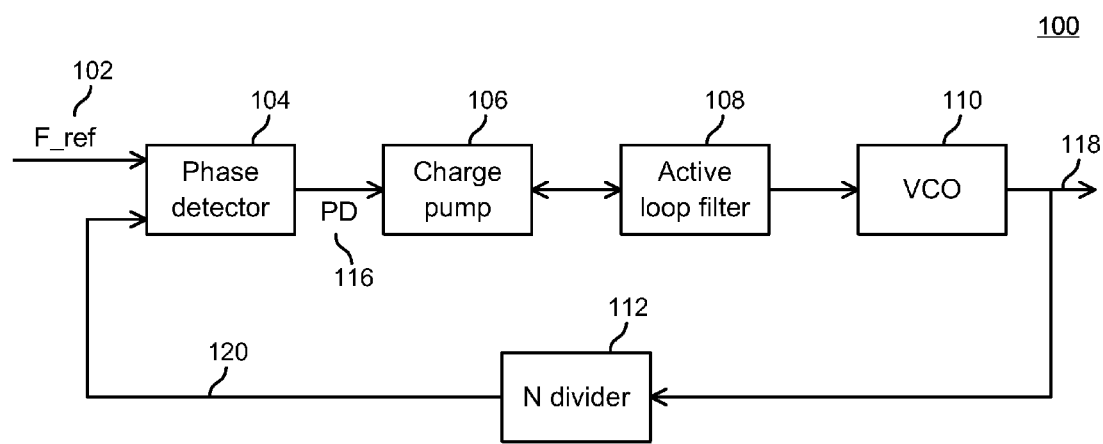
FIG. 1 is a block diagram of a fractional-N phase-locked loop circuit.

Referring to FIG. 1, in some examples, a fractional-N phase-locked loop circuit 100 includes a reference source that provides a reference signal 102, a phase frequency detector 104, a charge pump 106, an active loop filter 108, a voltage controlled oscillator 110, and an N divider 112. The output of the voltage controlled oscillator 110 is compared with the reference signal 102 at the phase frequency detector 104, and the phase difference is used to generate a pump-down signal 116 to control the charge pump 106 to discharge an integrating capacitor in the active loop filter 108. The reference signal 102 can be a clock signal. The output of the voltage controlled oscillator 110 can also be a clock signal. The output voltage of the active loop filter 108 is provided to the voltage controlled oscillator 110 to adjust the frequency and phase of an output signal 118. The output signal 118 is sent to the N divider 112 to generate a signal 120 that is compared with the reference signal 102. The phase-locked loop forms a negative feedback loop that is configured so that in a locked state, the frequency of the reference signal 102 is equal to the frequency of the output signal 118 divided by N, N being an integer at any given time. In some examples, the reference signal 102 is generated by dividing a source signal by a factor R, R being an integer at any given time. The N and R factors are selected so that the frequencies of the reference signal 102 and the signal 120 are equal when the output signal 118 is at a desired frequency. The values for N and R may be adjusted by another circuit, such as a delta-sigma modulator. The N and R values may change over time such that the average N value can have an integer and a fractional part, and the average R value can have an integer and a fractional part.

As will be described below, the charge pump 106 and the active loop filter 108 are designed and configured to have a low flicker noise and a small area size when the phase-locked loop circuit 100 is implemented in an integrated circuit. In addition, the active loop filter 108 has a reference voltage that can be controlled in order to control the magnitude of the pump-down current from the charge pump 106. The modification of the charge pump current can be performed as part of an overall phase-locked loop calibration that attempts to make the PLL loop gain constant. In some examples, the charge pump current is modified to counteract variations in the VCO gain.

Figure 2:
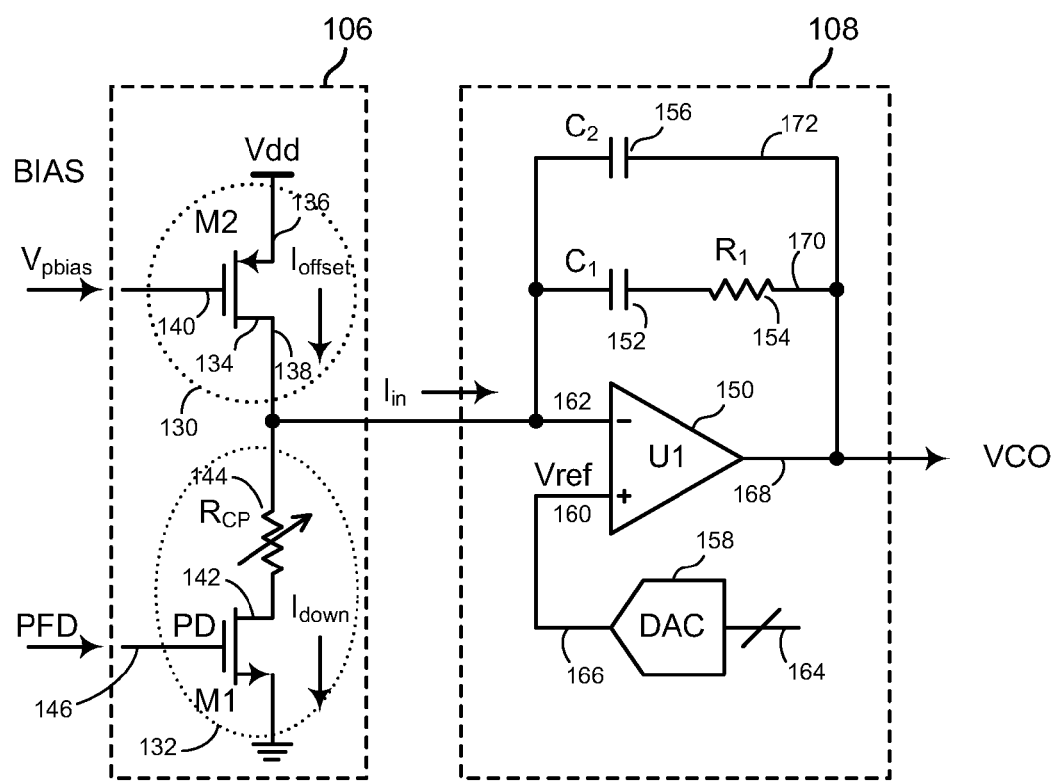
FIG. 2 is a block diagram of a charge pump and an active loop filter.

Referring to FIG. 2, in some implementations, the charge pump 106 includes a pump-up section 130 and a pump-down section 132. The pump-up section 130 functions as a current source that is connected between a first voltage Vdd (e.g., provided by a positive power supply) and a node 134 that is coupled to the active loop filter 108. The pump-down section 132 functions as a current source that is connected between the node 134 and a second voltage, such as an electric ground (or a negative voltage provided by a negative power supply). The pump-up section 130 provides a pump-up current (e.g., $I_{offset}$) to the active loop filter 108, whereas the pump-down section 132 draws a pump-down current (e.g., $I_{down}$) from the active loop filter 108.

In this example, the pump-up section 130 includes a P-type metal oxide semiconductor field effect transistor (MOSFET) 134 that is biased to operate in the active region. The PMOS transistor 134 has a drain 136 that is connected to the positive power supply Vdd, a source 138 that is connected to the node 134, and a gate 140 that is connected to a bias voltage $V_{pbias}$. The bias voltage $V_{pbias}$ is selected to cause the PMOS transistor 134 to operate in the active region to provide an offset current $I_{offset}$.

The charge pump 106 may have several advantages. For example, the charge pump 106 may have a lower noise. PMOS transistors have lower intrinsic flicker noise (compared to NMOS transistors). Because the offset current $I_{offset}$ is low, the PMOS transistor 134 does not contribute much noise. The NMOS transistor 142 also does not generate much noise because it is either off or operates in the triode region. In current cellular transceivers, a large portion of the in-band PLL phase noise is contributed by charge pump noise. By lowering the charge pump noise, the loop filter capacitor size can be reduced, and thus the cost of a transceiver that includes the phase-locked loop circuit 100 can be reduced. The phase-locked loop circuit 100 can be used in, e.g., mobile phones, televisions, and many other electronic devices.

The phase-locked loop circuit 100 can be implemented as an integrated circuit. Using an active PMOS transistor to generate the leakage current $I_{offset}$ can reduce the area required for the charge pump 106. Because the desired leakage current $I_{offset}$ is small, if the leakage current is produced using a resistor, a large resistor would be needed, requiring a larger area than the PMOS transistor. Also, a PMOS transistor operating in the active region may have a higher power supply rejection ratio (PSRR) to the power supply than if a resistor were used. Using a resistor in the pump-down section 132 allows a pump-down switch (e.g., 142) to be placed on the ground side of the resistor, which minimizes charge injection and is beneficial for charge pump linearity.

By operating the PMOS transistor 134 in the active region to provide a constant offset current, it prevents the PLL circuit 100 from entering a so-called "dead zone" of the phase detector, which refers to a narrow frequency band such that within this zone, the feedback clock signal and the external clock signal are so close in phase that there are no correction pulses out of the phase-detector circuit. If the PLL circuit 100 enters the dead zone, the offset current causes the PLL circuit 100 to move away from the dead zone and the phase detector starts correcting phases again.

The pump-down section 132 includes an N-type MOSFET 142 and a digitally controlled variable resistor 144. The variable resistor 144 can have, e.g., a bank of series and/or parallel connected resistors that can be selected through switches. The transistor 142 functions as a switch that is controlled by a phase detection (PD) signal 146 provided by the phase frequency detector 104. When the PD signal 146 is high, the transistor 142 is turned on (operating in the triode region), allowing a pump-down current $I_{down}$ to flow through the resistor 144. When the PD signal 146 is low, the NMOS transistor 142 is turned off, which shuts off the pump-down current so that $I_{down}$=0. In some examples, the leakage current $I_{offset}$ is configure to be about 10% of the pump-down current $I_{down}$. The leakage current can also be other values in order to avoid the dead zone.

In some examples, when the pump-down current level is adjusted, the bias voltage $V_{pbias}$ is also adjusted so that the leakage current $I_{offset}$ is maintained at about 10% of the pump-down current $I_{down}$. In some examples, an array of PMOS transistors that can be individually selected are used in the pump-up section 130, and one or more of the PMOS transistors are selected to generate a desired leakage current.

The current flowing into the active loop filter is denoted as $I_{in}$. When the NMOS transistor 132 is turned off, the leakage current $I_{offset}$ flows to the active loop filter 108, so $I_{in}=I_{offset}$. When the NMOS transistor 142 is turned on, the pump-down section 132 draws a pump-down current $I_{down}$ so that the current flowing into the active loop filter is $I_{in}=I_{offset}-I_{down}$. The pump-down current $I_{down}$ is equal to the voltage across the variable resistor 144 divided by the resistance $R_{CP}$ of the variable resistor 144. The voltage across the variable resistor 144 is equal to the voltage at node 134 minus the drain-source voltage $V_{DS1}$ of the NMOS transistor 132. When the NMOS transistor is switched on, the drain-source voltage $V_{DS1}$ is typically small, so the pump-down current $I_{down}$ is mostly determined by the voltage at the node 134 and the resistance $R_{CP}$ of the variable resistor 144.

The active loop filter 108 includes an operational amplifier 150 that has a positive input node 160 and a negative input node 162. The negative input node 162 is connected to the node 134. A digital-to-analog converter 158 receives a digital signal 164 and outputs an analog signal 166 to the positive input node 160. A feedback network is provided between an output 168 of the operational amplifier 150 and the negative input 162. The feedback network includes a capacitor $C_1$ 152 connected in series with a resistor $R_1$ 154, and a capacitor $C_2$ 156 connected in parallel with the capacitor $C_1$ 152. For example, the capacitor $C_1$ 152 can be much larger than the capacitor $C_2$ 156.

The feedback network and the operational amplifier 150 form a negative feedback loop. The gain of the amplifier and the negative feedback cause the voltage at the negative input node 162 to be substantially equal to the voltage at the positive input node 160, which is equal to the output of the digital-to-analog converter 158. By controlling the reference voltage Vref using the digital-to-analog converter 158, the voltage at the negative input node 162 can be controlled, which controls the pump-down current $I_{down}$ and in turn controls the current $I_{in}$ flowing into the active loop filter 108. The current $I_{in}$ affects the loop gain of the phase-locked loop circuit 100. By using the reference voltage $V_{ref}$ that is adjustable, the pump-down current $I_{down}$ can be varied over a greater range than if a fixed reference voltage $V_{ref}$ is used.

For example, if the reference voltage $V_{ref}$ is fixed at 1V, and we desire the pump-down current $I_{down}$ to vary from 1 µA to 1 mA, the variable resistor 144 would need to vary from 1 MΩ to 1 kΩ, which would require a resistor of a large size. By using a digital-to-analog converter 158 that adjusts the reference voltage $V_{ref}$ to be as low as 100 mV, the variable resistor 144 only needs to vary from 1 kΩ to 100 kΩ, which requires a much smaller size.

The pump-down current $I_{down}$ is affected by both the resistance value $R_{CP}$ of the variable resistor, and the digital input 164 to the digital-to-analog converter. In some examples, the resistor value $R_{CP}$ is digitally controlled. In some examples, both the resistor value $R_{CP}$ and the digital input 164 to the digital-to-analog converter 158 are controlled by a control circuit to maintain a constant loop gain for the phase-locked loop circuit 100.

For example, the loop gain G can be expressed as:

$$G=(I_{CP}*K_V)/(N*C_t),$$

in which $I_{CP}$ represents the charge pump current (unit: A), $K_V$ represents the VCO tuning gain (unit: Hz/V), N represents a programmed value of the feedback divider 112 (unitless), and $C_t$=C1+C2 represents the loop filter capacitor value (unit: F).

The charge pump current $I_{CP}$ affects the loop gain. In general, it is preferable to have a constant loop gain across all process/voltage/temperature (PVT) conditions. During operation, sometimes the VCO may have a large gain variation. The VCO gain is expressed as change in frequency per change in voltage or units of Hz/V. A calibration state machine measures the gain of the VCO, and based on the measured gain it will adjust the charge pump current to compensate for variations in the VCO gain, thereby maintaining a constant PLL loop gain.

Because the pump-down current $I_{down}$ is controlled by controlling the reference voltage $V_{ref}$, it is preferable that the pump-up leakage current be unaffected by the changes in the reference voltage $V_{ref}$. Using a PMOS transistor operating in the active region instead of using a resistor achieves this goal.

During operation of the phase-locked loop circuit 100, the bias voltage $V_{bias}$ causes the PMOS transistor 134 to operate in the active region to maintain a constant leakage current $I_{offset}$. The phase/frequency detector 104 controls the PD signal 146 based on the results of the comparison between the feedback signal 120 and the reference signal 102. When the PD signal 146 is high, the NMOS transistor 132 is turned on, and a pump-down current approximately equal to $I_{down}=V_{ref}/R_{CP}$ flows through the resistor 144, and a discharge current $-I_{in}=-(I_{offset}-I_{down})$ discharges the capacitors C1 and C2 in the active loop filter 108. When the PD signal 146 is low, the NMOS transistor 142 is turned off, and a pump-up current equal to the leakage current $I_{offset}$ charges the capacitors $C_1$ and $C_2$ in the active loop filter 108. The magnitude of the pump-down current $I_{down}$ can be adjusted by changing the resistance $R_{CP}$ of the variable resistor 144, changing the reference voltage $V_{ref}$, or both. The pump-down current $I_{down}$ (as well as the current drawn from the active loop filter 108) can be set to a minimum value by setting the resistance of the variable resistor 144 to a maximum value among a plurality of possible values for the resistance, and setting the reference voltage $V_{ref}$ to a minimum value among a plurality of possible values for the output of the digital-to-analog converter 158.

Figure 3:
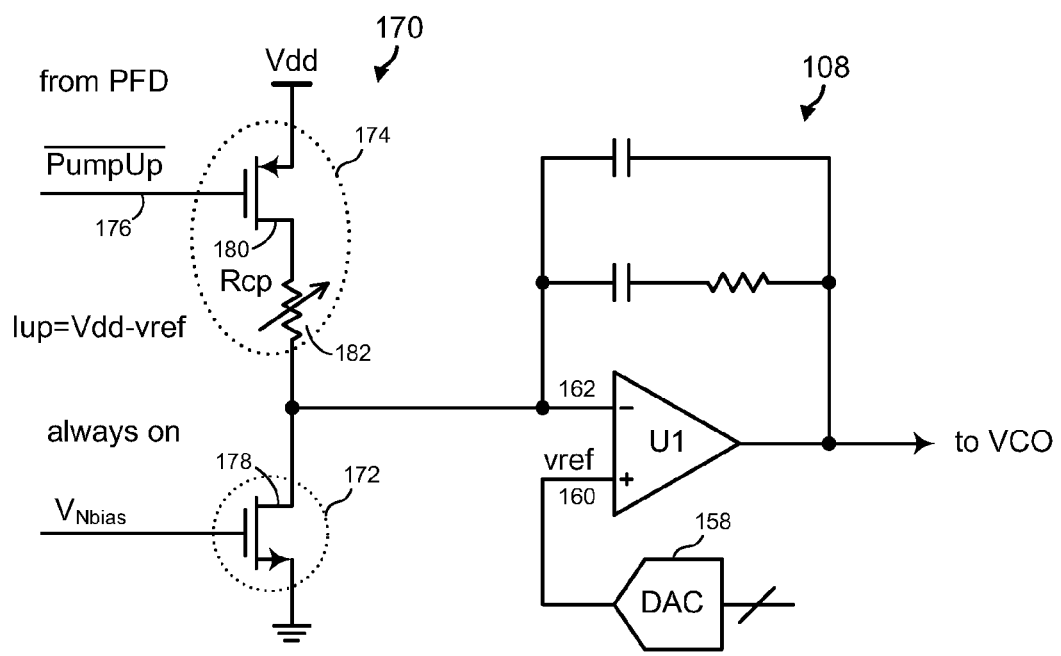
FIG. 3 is a block diagram of another charge pump and an active loop filter.

Referring to FIG. 3, in some examples, a charge pump 170 can be implemented by using a pump-down section 172 that generates a constant leakage current, and a pump-up section 174 that is controlled by an inverted pump-up signal 176 from the phase/frequency detector 104. Each of the pump-down section 172 and the pump-up section 174 functions as a current source. In this example, the pump-down section 172 includes an NMOS transistor 178 that is biased by a bias voltage $V_{nbias}$ to operate in an active region to provide a pump-down leakage current. The pump-up section 174 includes a PMOS transistor 180 that functions as a switch to turn on or off a pump-up current that flows through a digitally controlled variable resistor 182.

When the reference voltage $V_{ref}$ is adjusted by using the digital-to-analog converter 158, the voltage at the negative input node 162 follows the reference voltage $V_{ref}$ at the positive input node 160. When $V_{ref}$ varies, the pump-down current flowing through the NMOS transistor 178 remains substantially the same, while the pump-up current $I_{up}$ flowing through the variable resistor 182 depends on the reference voltage $V_{ref}$ according to the relationship:

$$I_{up}=(Vdd-V_{DS2}-V_{ref})/R_{CP},$$

where $V_{DS2}$ is the drain-source voltage for the PMOS transistor 180.

The charge pump 170 has several advantages, similar to those of the charge pump 106 (FIG. 2). For example, using an active NMOS transistor to generate the leakage current can reduce the area required for the charge pump 170. Because the desired leakage current is small, if the leakage current is produced using a resistor, a large resistor would be needed, requiring a larger area than the NMOS transistor. By using a reference voltage $V_{ref}$ that is adjustable, the pump-up current can be varied over a greater range than if a fixed reference voltage $V_{ref}$ is used.

Figure 4:
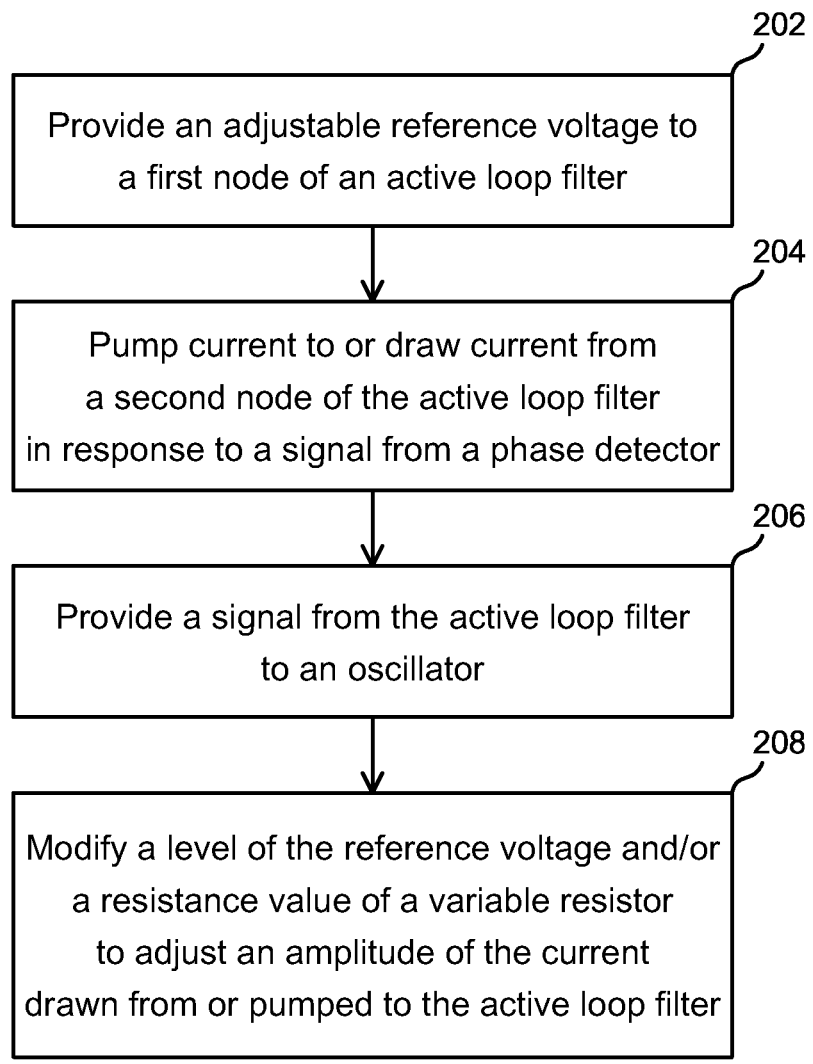
FIG. 4 is a flow diagram of a process for operating a charge pump phase-locked loop circuit.

FIG. 4 is a flow diagram of an example process 200 for operating a charge pump phase-locked loop circuit. For example, the process 200 can be implemented using the phase-locked loop circuit 100. In the process 200, an adjustable reference voltage is provided to a first node of an active loop filter (202). For example, the first node can be the positive input node 160 of the operational amplifier 150. Current is pumped to or drawn from a second node of the active loop filter in response to a signal from a phase detector (204). For example, the second node can be the negative input node 162 of the operational amplifier 150. A signal from the active loop filter is provided to an oscillator (206). For example, the oscillator can be the voltage controlled oscillator 110. A level of the reference voltage is modified and/or a resistance value of a variable resistor to adjust an amplitude of the current drawn from or pumped to the active loop filter (208). For example, the reference voltage can be the reference voltage $V_{ref}$ generated by the digital-to-analog converter 158.

For example, in the process 200, drawing current from the active loop filter can include passing at least a portion of the current through the variable resistor. A resistance value of the variable resistor can be modified to adjust the amplitude of the current drawn from the active loop filter. The current drawn from the active loop filter can be set to a minimum value by setting the resistance of the variable resistor to a maximum value among a plurality of possible values for the resistance and setting the reference voltage to a minimum value among a plurality of possible values for the reference voltage. The reference voltage can be generated using a digital-to-analog converter, and a digital signal provided to the digital-to-analog converter can be controlled to modify the reference voltage. Pumping current to the active loop filter can include providing an offset current from a transistor operating in an active region. Pumping current to or drawing current from the active loop filter can include operating a P-type transistor in an active region to provide an offset current to the active loop filter, and operating an N-type transistor as a switch to turn on or off the current drawn from the active loop filter in response to the signal from the phase detector. A level of the reference voltage can be modified to adjust an amplitude of the current drawn from the active loop filter.

A number of implementations have been described. Nevertheless, it will be understood that various modifications may be made. For example, elements of one or more implementations may be combined, deleted, modified, or supplemented to form further implementations. As yet another example, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. An apparatus comprising:
    a charge pump phase-locked loop circuit comprising:
        an active loop filter comprising an amplifier that has a negative input node, a positive input node, and an output node, in which a feedback path is provided between the output node and the negative input node, the feedback path including a capacitor;
        an adjustable reference voltage source that is electrically coupled to the positive input node of the amplifier to provide a reference voltage that is adjustable; and
        a charge pump electrically coupled to the negative input node of the amplifier to provide a current to or sink a current from the active loop filter in response to a signal from a phase detector, the charge pump comprising a first current source electrically coupled to a first voltage and a second current source electrically coupled to a second voltage, the second current source comprising a resistor, and the second current source is configured such that a current provided by the second current source depends on a resistance value of the resistor and a difference between the reference voltage and the second voltage, wherein the adjustable reference voltage source comprises a digital-to-analog converter to receive a digital input signal and output the reference voltage provided to the positive input node of the amplifier.

2. The apparatus of claim 1 in which the second voltage is lower than the first voltage, the first current source comprises a PMOS transistor operating in an active region to provide an offset current to the active loop filter, and the second current source comprises an NMOS transistor that is turned on or off by the signal from the phase detector.

3. The apparatus of claim 1, comprising a control circuit to control the adjustable reference voltage source to adjust the reference voltage to control a magnitude of the current flowing from the active loop filter to the second current source.

4. The apparatus of claim 1 in which the resistor in the second current source comprises a variable resistor, and the apparatus further comprising a control circuit to control the variable resistor to adjust the resistance value of the resistor to control a magnitude of the current flowing between the active loop filter and the second current source.

5. The apparatus of claim 4 in which the control circuit is configured to control a magnitude of the current flowing between the active loop filter and the second current source by also controlling the adjustable reference voltage source to adjust the reference voltage.

6. The apparatus of claim 5 in which the control circuit is configured to set the current flowing between the active loop filter and the second current source to a minimum value by setting the resistance of the resistor to a maximum value among a plurality of possible values for the resistance and setting the reference voltage to a minimum value among a plurality of possible values for the reference voltage.

7. The apparatus of claim 1 in which the first current source comprises a transistor that is configured to operate in an active region and provide an offset current to the active loop filter.

8. The apparatus of claim 1 in which the first current source is configured to provide an offset current to the active loop filter that is independent of the signal from the phase detector, and the second current source is configured to switch on or off in response to the signal from the phase detector.

9. The apparatus of claim 1 in which the charge pump phase-locked loop circuit comprises a fractional-N phase-locked loop circuit.

10. An apparatus comprising:
a phase-locked loop circuit comprising:
an adjustable voltage reference source to output a reference voltage that is adjustable;
an active loop filter having a first node, a second node, and third node, in which the first node is configured to receive the reference voltage from the adjustable voltage reference source, the second node has a voltage that is configured to track the reference voltage, and the third node provides a signal to an oscillator;
a charge pump circuit electrically coupled to the second node of the active loop filter to pump current to or draw current from the active loop filter, in which the current drawn from the active loop filter is configured to be dependent on the reference voltage, and an operation of the charge pump circuit is dependent on a signal received from a phase detector; and a control circuit to control the reference voltage to control a magnitude of the current drawn from the active loop filter by the charge pump circuit, wherein the charge pump circuit comprises a variable resistor, and the control circuit also controls a resistance value of the variable resistor to control the magnitude of the current drawn from the active loop filter by the charge pump circuit.

11. The apparatus of claim 10 in which the control circuit is configured to set the current flowing from the active loop filter to the second current source to a minimum value by setting the resistance of the resistor to a maximum value among a plurality of possible values for the resistance and setting the reference voltage to a minimum value among a plurality of possible values for the reference voltage.

12. A method of operating a charge pump phase-locked loop circuit, the method comprising:
providing an adjustable reference voltage to a first node of an active loop filter;
pumping current to or drawing current from a second node of the active loop filter in response to a signal from a phase detector;
providing a signal from the active loop filter to an oscillator; and
modifying a level of the reference voltage to adjust an amplitude of the current drawn from or pumped to the active loop filter,
wherein drawing current from the active loop filter comprises passing at least a portion of the current through a variable resistor, and the method comprises modifying a resistance value of the variable resistor to adjust the amplitude of the current drawn from the active loop filter.

13. The method of claim 12, comprising setting the current drawn from the active loop filter to a minimum value by setting the resistance of the variable resistor to a maximum value among a plurality of possible values for the resistance and setting the reference voltage to a minimum value among a plurality of possible values for the reference voltage.

14. The method of claim 12, comprising generating the reference voltage using a digital-to-analog converter, and controlling a digital signal provided to the digital-to-analog converter to modify the reference voltage.

15. The method of claim 12 in which pumping current to the active loop filter comprise providing an offset current from a transistor operating in an active region.

16. The method of claim 12 in which pumping current to or drawing current from the active loop filter comprises operating a P-type transistor in an active region to provide an offset current to the active loop filter, and operating an N-type transistor as a switch to turn on or off the current drawn from the active loop filter in response to the signal from the phase detector.

17. The method of claim 12, comprising modifying a level of the reference voltage to adjust an amplitude of the current drawn from the active loop filter.

* * * * *